United States Patent
Hung et al.

(10) Patent No.: US 9,263,429 B2
(45) Date of Patent: Feb. 16, 2016

(54) SEMICONDUCTOR DEVICE AND MANUFACTURING METHOD OF THE SAME

(71) Applicant: MACRONIX INTERNATIONAL CO., LTD., Hsinchu (TW)

(72) Inventors: Chih-Ling Hung, Kaohsiung (TW); Hsin-Liang Chen, Taipei (TW); Wing-Chor Chan, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 170 days.

(21) Appl. No.: 13/969,653

(22) Filed: Aug. 19, 2013

(65) Prior Publication Data

US 2015/0048415 A1 Feb. 19, 2015

(51) Int. Cl.
*H01L 27/02* (2006.01)
*H01L 27/06* (2006.01)
*H01L 29/74* (2006.01)

(52) U.S. Cl.
CPC ........ *H01L 27/0262* (2013.01); *H01L 27/0629* (2013.01); *H01L 29/7436* (2013.01)

(58) Field of Classification Search
CPC ....................................................... H01L 27/02
USPC ......................................... 257/358; 361/91.5
See application file for complete search history.

(56) References Cited

U.S. PATENT DOCUMENTS

| | | | | |
|---|---|---|---|---|
| 5,854,504 A | * | 12/1998 | Consiglio | ........... H01L 27/0251 257/358 |
| 2012/0182659 A1 | * | 7/2012 | Wang | ................... H01L 27/0262 361/91.5 |

* cited by examiner

*Primary Examiner* — Kevin Parendo
*Assistant Examiner* — Ismail Muse
(74) *Attorney, Agent, or Firm* — McClure, Qualey & Rodack, LLP

(57) ABSTRACT

A semiconductor device and a manufacturing method of the same are provided. The semiconductor device includes a substrate, a first doping region, a first well, a resistor element, and a first, a second, and a third heavily doping regions. The first well and the third heavily doping region are disposed in the first doping region, which is disposed on the substrate. The first heavily doping region and the second heavily doping region, which are separated from each other, are disposed in the first well. The second and the third heavily doping regions are electrically connected via the resistor element. Each of the substrate, the first well, and the second heavily doping region has a first type doping. Each of the first doping region, the first heavily doping region, and the third heavily doping region has a second type doping, complementary to the first type doping.

14 Claims, 14 Drawing Sheets

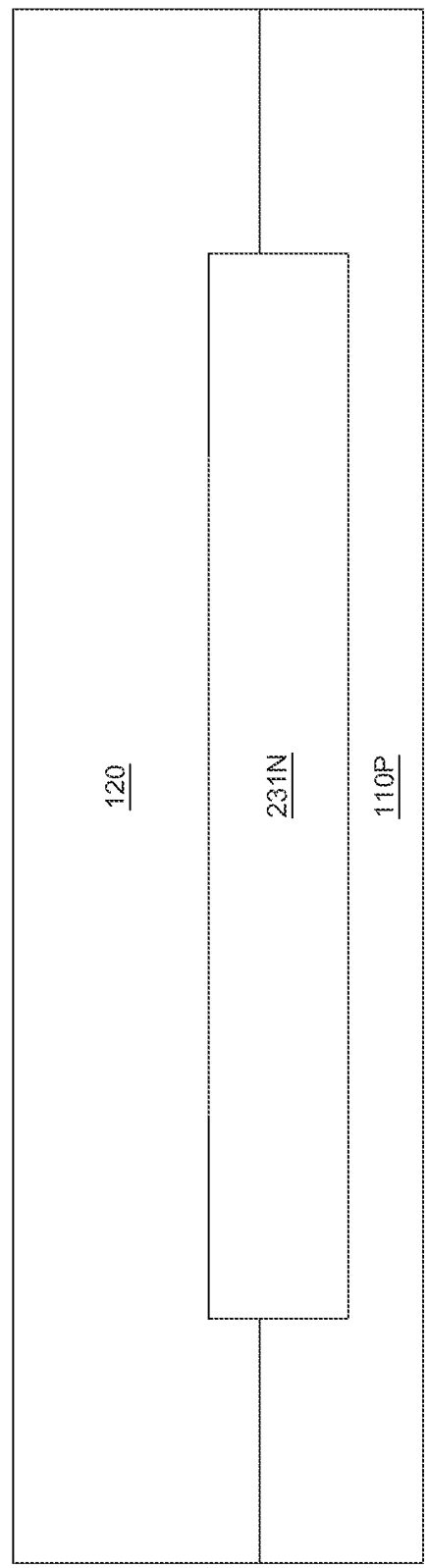

SEMICONDUCTOR DEVICE AND MANUFACTURING METHOD OF THE SAME

BACKGROUND

1. Technical Field

The disclosure relates in general to a semiconductor device and a manufacturing method thereof, and particularly to a semiconductor device with a reduced substrate leakage and a manufacturing method thereof.

2. Description of the Related Art

With the development of semiconductor technology, varied semiconductor elements are invented. For example, memories, transistors and diodes are widely used in electric devices.

In the development of semiconductor technology, researchers try to improve those semiconductor elements, such as reducing the volume, increasing/reducing the turn on voltage, increasing/reducing the breakdown voltage, reducing the electric leakage and solving the ESD issue.

SUMMARY

The disclosure is directed to a semiconductor device and a manufacturing method thereof. In the embodiments, the semiconductor device includes a thyristor, which has an equivalent NPN transistor and an equivalent PNP transistor, and the base of the equivalent NPN transistor is electrically connected to the collector of the equivalent NPN transistor (that is, the base of the equivalent PNP transistor) via a resistor element; as such, a potential drop is generated between the base and the collector of the equivalent NPN transistor, the undesired current can be directed to the emitter of the equivalent NPN transistor, and hence, the substrate leakage of the semiconductor device is reduced, and the electrostatic discharge (ESD) protection to the device is improved.

According to an embodiment of the present disclosure, a semiconductor device is provided. The semiconductor device includes a substrate, a first doping region, a first well, a first heavily doping region, a second heavily doping region, a third heavily doping region, and a resistor element. The first doping region is disposed on the substrate. The first well is disposed in the first doping region. The first heavily doping region and the second heavily doping region are disposed in the first well, and the second heavily doping region is separated from the first heavily doping region. The third heavily doping region is disposed in the first doping region. The second heavily doping region is electrically connected to the third heavily doping region via the resistor element. Each of the substrate, the first well, and the second heavily doping region has a first type doping, each of the first doping region, the first heavily doping region, and the third heavily doping region has a second type doping, and the first type doping is complementary to the second type doping.

According to another embodiment of the present disclosure, a semiconductor device is provided. The semiconductor device includes a thyristor and a resistor element. The thyristor has an equivalent NPN transistor and an equivalent PNP transistor. The base of the equivalent NPN transistor is electrically connected to the base of the equivalent PNP transistor via the resistor element.

According to a further embodiment of the present disclosure, a manufacturing method of a semiconductor device is provided. The manufacturing method includes the following steps: providing a substrate; forming a first doping region on the substrate; forming a first well in the first doping region; forming a first heavily doping region in the first well; forming a second heavily doping region in the first well, wherein the second heavily doping region is separated from the first heavily doping region; forming a third heavily doping region in the first doping region; and forming a resistor element, wherein the second heavily doping region is electrically connected to the third heavily doping region via the resistor element; wherein each of the substrate, the first well, and the second heavily doping region has a first type doping, each of the first doping region, the first heavily doping region, and the third heavily doping region has a second type doping, and the first type doping is complementary to the second type doping.

The above and other embodiments of the disclosure will become better understood with regard to the following detailed description of the non-limiting embodiment(s). The following description is made with reference to the accompanying drawings.

BRIEF DESCRIPTION OF THE DRAWINGS

FIGS. 4A-4F illustrate a manufacturing method of the semiconductor device of the second embodiment;

DETAILED DESCRIPTION

In the embodiments of the present disclosure, a semiconductor device and a method of manufacturing the same are provided. In the embodiments, the semiconductor device includes a thyristor, which has an equivalent NPN transistor and an equivalent PNP transistor, and the base of the equivalent NPN transistor is electrically connected to the collector of the equivalent NPN transistor (that is, the base of the equivalent PNP transistor) via a resistor element; as such, a potential drop is generated between the base and the collector of the equivalent NPN transistor, the undesired current can be directed to the emitter of the equivalent NPN transistor, and hence, the substrate leakage of the semiconductor device is reduced, and the electrostatic discharge (ESD) protection to the device is improved. The following embodiments are for the purpose of elaboration only, not for limiting the scope of protection of the invention. Besides, secondary elements are omitted in the following embodiments to highlight the technical features of the invention.

First Embodiment

Figure 1:
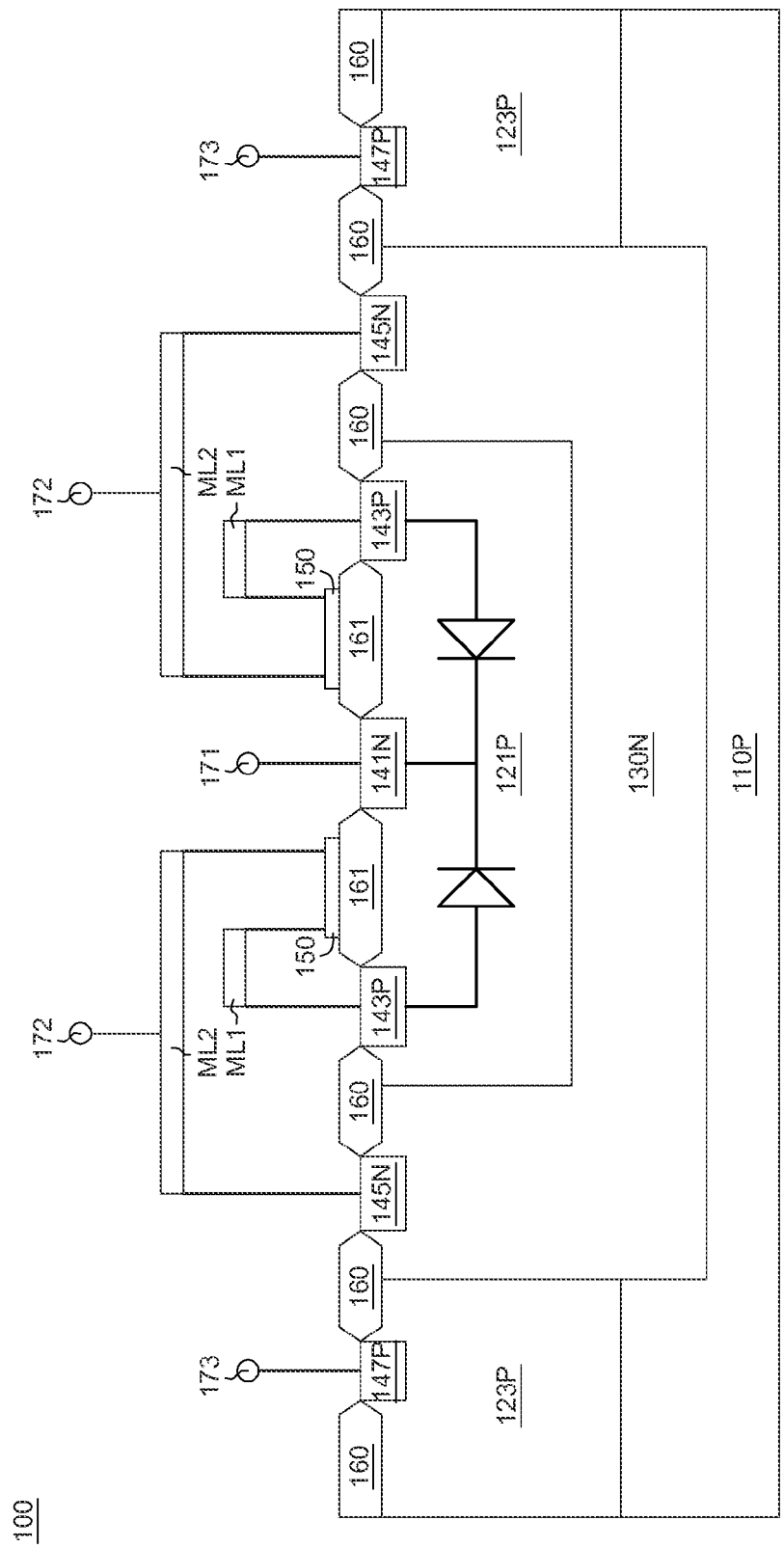
FIG. 1 shows a cross-section view of a semiconductor device of the first embodiment.

Referring to FIG. 1, a cross-section view of a semiconductor device 100 of the first embodiment is shown. The semiconductor device 100 comprises a substrate 110P, a first doping region 130N, a first well 121P, a first heavily doping region 141N, a second heavily doping region 143P, a third heavily doping region 145N, and a resistor element 150.

The material of the substrate 110P can be P type silicon or N type silicon, for example. The first doping region 131N is disposed on the substrate 110P, and the first well 121P is disposed in the first doping region 130N. The first doping region 130N and the first well 121P may be a P type well or an N type well. The first doping region 130N may also be a deep N type well. The first well 121P may also be a P type well/P+ buried layer stacked layer, a P+ implant layer, an N type well/N+ buried layer stacked layer, an N+ implant layer, or a deep N type well.

The first heavily doping region 141N and the second heavily doping region 143P are disposed in the first well 121P, and the first heavily doping region 141N and the second heavily doping region 143P are separated from each other. The third heavily doping region 145N is disposed in the first doping region 130N. The doping concentrations of the first, second, and third heavily doping regions 141N, 143P, and 145N are larger than that of the first and second wells 121P and the first doping region 130N, such that good Ohmic contacts are provided. The first, second, and third heavily doping regions 141N, 143P, and 145N may be P type heavily doping regions (P+) or N type heavily doping regions (N+).

The second heavily doping region 143P is electrically connected to the third heavily doping region 145N via the resistor element 150. The resistor element 150 is such as a polysilicon layer.

Each of the substrate 110P, the first well 121P, and the second heavily doping region 143P has a first type doping, such as P type doping or N type doping. Each of the first doping region 130N, the first heavily doping region 141N, and the third heavily doping region 145N has a second type doping, such as N type doping or P type doping. The first type doping is complementary to the second type doping. In the present embodiment, the first type doping is P type doping, and the second type doping is N type doping.

As shown in FIG. 1, in the embodiment, the semiconductor device 100 may further include a field oxide (FOX) 161 disposed on the first well 121P and located between the first heavily doping region 141N and the second heavily doping region 143P to separate the two regions from each other. Besides, the semiconductor device 100 may further include a field oxide 160 disposed on the junction between the first well 121P and the first doping region 130N. The material of the field oxides 160 and 161 is such as silicon dioxide ($SiO_2$), of which the structure may be a local oxidation of silicon (LOCOS), as shown in FIG. 1, or a shallow trench isolation (STI).

In the embodiment, the resistor element 150 may be disposed in the internal structure of the semiconductor device 100 or in an external structure. In the present embodiment, as shown in FIG. 1, the polysilicon layer (resistor element 150) is disposed on the field oxide 161, which is disposed on the first well 121P. Compared to disposing the resistor element 150 in an external structure, the resistor element 150 disposed in the internal structure of the semiconductor device 100 is advantageous to reducing the overall size of the device.

In the embodiment, as shown in FIG. 1, the semiconductor device 100 may further include a second well 123P, which is disposed on the substrate 110P. The first doping region 130N is disposed between the first well 121P and the second well 123P, and the second well 123P has the first type doping.

In the embodiment, as shown in FIG. 1, the semiconductor device 100 may further include a fourth heavily doping region 147P disposed in the second well 12P. The fourth heavily doping region 147P has the first type doping.

As shown in FIG. 1, a path through the first electrode 171, the first heavily doping region 141N, the first well 121P, the second heavily doping region 143P, the resistor element 150, and the second electrode 172 forms an isolation diode. While the isolation diode is applied a forward biased voltage, there is an impedance which is at least 0.7 V. While the isolation diode is applied a reverse biased voltage, there is an impedance which is at least 30 V.

Moreover, the first heavily doping region 141N can be electrically connected to the first electrode 171, the second heavily doping region 143P can be electrically connected to the second electrode 172 via the resistor element 150, and the fourth heavily doping region 147P can be electrically connected to the third electrode 173. For example, the first electrode 171 can be a cathode electrode, the second electrode 172 can be an anode electrode, and the third electrode 173 can be a ground electrode. Due to the effect of the resistor element 150, a potential drop is generated between the first well 121P and the first doping region 130N, where the third heavily doping region 145N is located in, the potential of the first doping region 130N is higher than that of the first well 121P when a forward biased voltage is applied, and thus, the undesired current can be directed to the second electrode 172, the substrate leakage is reduced, and the electrostatic discharge protection is improved. The detailed functional mechanism will be discussed later.

Moreover, in addition to the effects of reducing substrate leakage and improving ESD protection, the arrangement of the polysilicon layer (resistor element 150), polysilicon being provided with field plate effect, may further increase the breakdown voltage of the isolation diode.

Figure 2A:
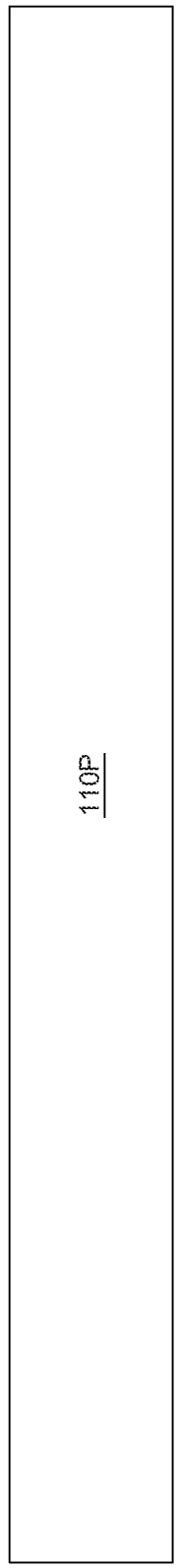
FIGS. 2A-2D illustrate a manufacturing method of the semiconductor device of the first embodiment.

Referring to FIGS. 2A-2D, a manufacturing method of the semiconductor device 100 of the first embodiment is illustrated. Firstly, as shown in FIG. 2A, the substrate 110P is provided.

Figure 2B:
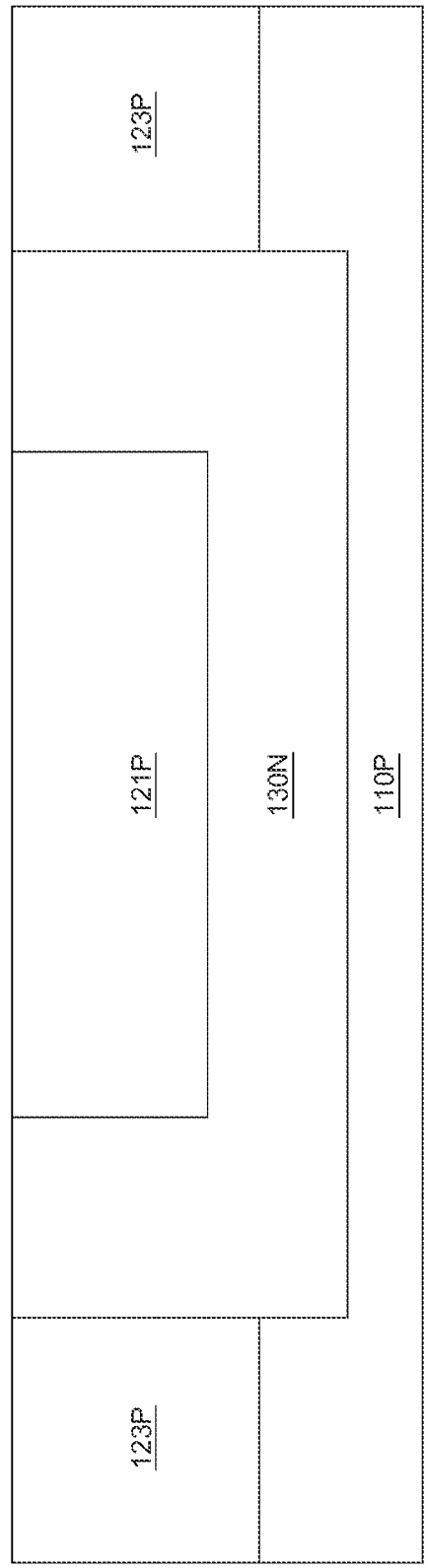

Next, as shown in FIG. 2B, the first doping region 130N is formed on the substrate 110P, and the first well 121P is formed in the first doping region 130N. In the embodiment, the second well 123P may be further formed on the substrate 110P, and the first doping region 130N is formed between the first well 121P and the second well 123P. In the embodiment, the first doping region 130N, the first well 121P, and the second well 123P are formed by such as a triple well process, and epitaxial steps are not required, which lowers the manufacturing costs.

Figure 2C:
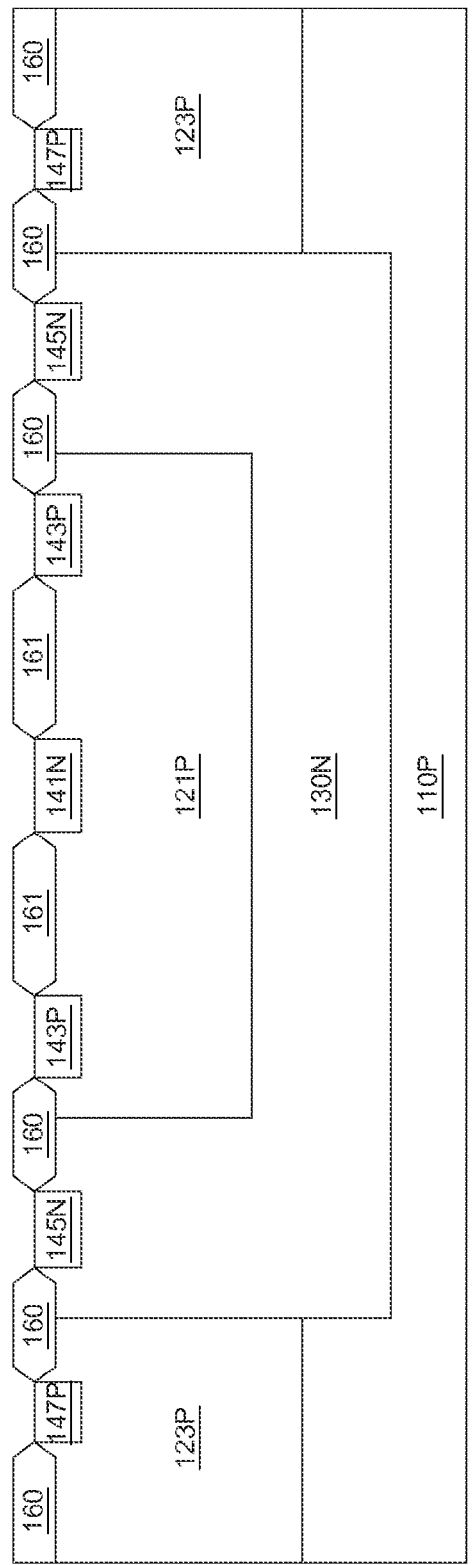

Next, as shown in FIG. 2C, the field oxide 161 is formed on the first well 121P and located between the first heavily doping region 141N and the second heavily doping region 143P. The field oxides 160 may also be formed on the junction between the first well 121P and the first doping region 130N.

And then, as shown in FIG. 2C, the first heavily doping region 141N and the second heavily doping region 143P are formed in the first well 121P, and the third heavily doping region 145N is formed in the first doping region 130N. The first heavily doping region 141N and the second heavily doping region 143P are separated from each other. In the embodiment, the fourth heavily doping region 147P may also be formed in the second well 123P.

Figure 2D:
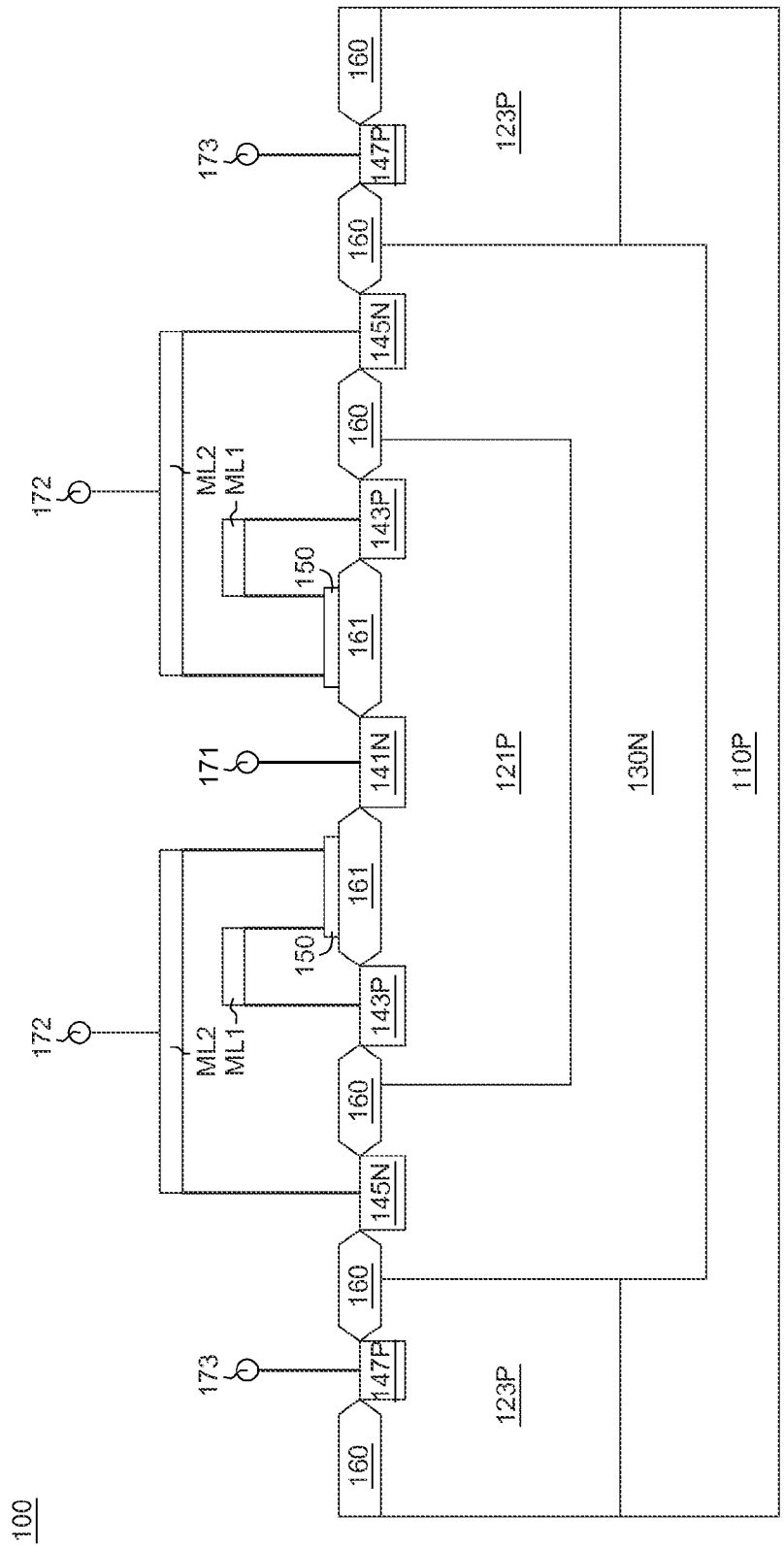

Next, as shown in FIG. 2D, the resistor element 150 is formed on the field oxide 161. In an alternative embodiment, the resistor element 150 may be formed on the field oxide 161 prior to the formation of the heavily doping regions 141N, 143P, 145N, and 147P. In the embodiments, the resistor element 150 is formed of a polysilicon layer, for example. Base on the above steps, the semiconductor device 100 can be manufactured.

Second Embodiment

Figure 3:
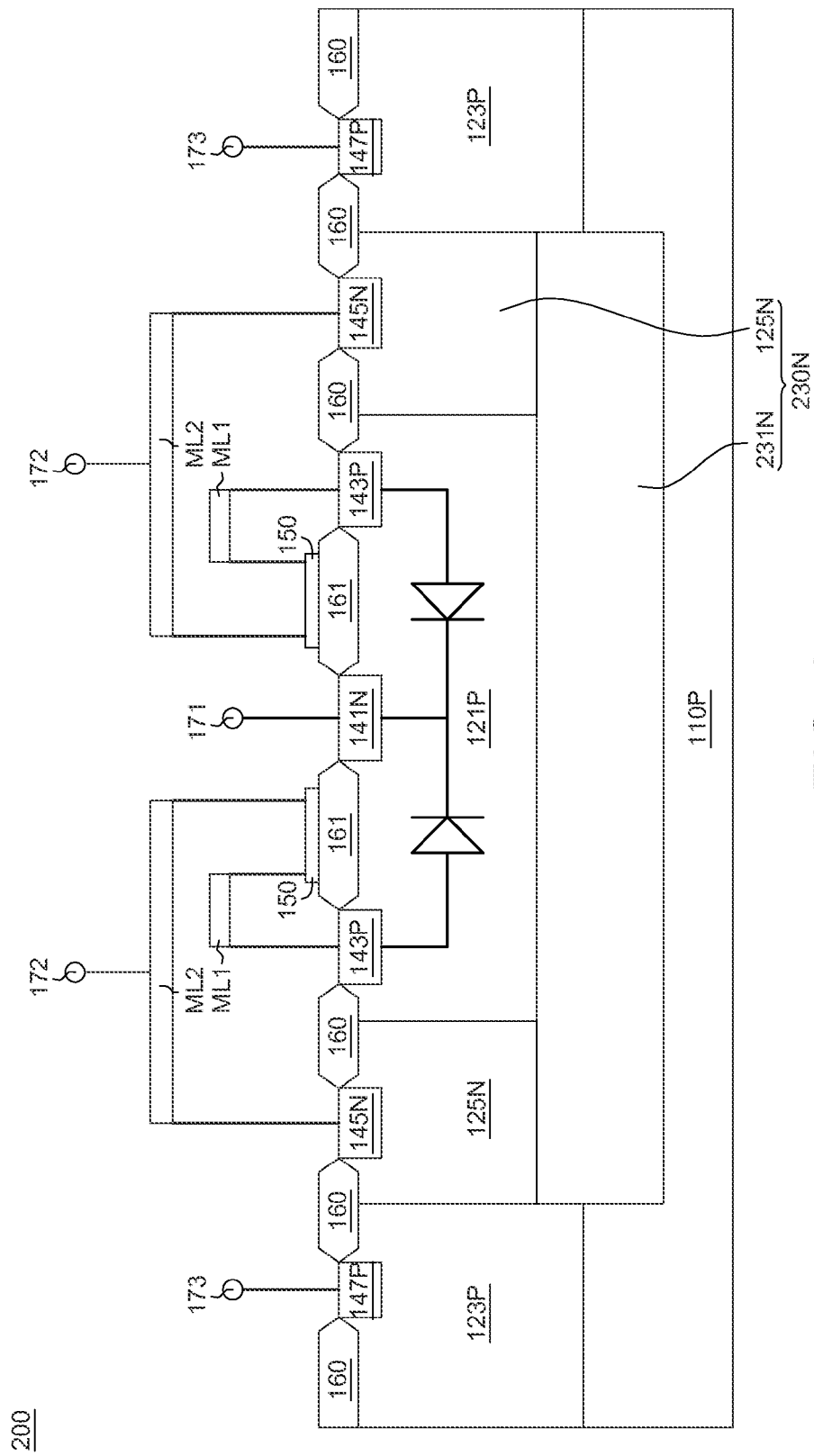
FIG. 3 shows a cross-section view of a semiconductor device of the second embodiment.

Referring to FIG. 3, a cross section view of a semiconductor device 200 of the second embodiment is shown. The semiconductor device 200 of the present embodiment is different from the semiconductor device 100 of the first embodiment in the design of the first doping region 230N, and the similarities are not repeated here.

As shown in FIG. 3, the first doping region 230N includes a buried layer 231N and a third well 125N. In the embodiment, the doping concentration of the buried layer 231N is larger than that of the third well 125N. The buried layer 231N is disposed below the first well 121P. The third well 125N is disposed on the buried layer 231N and located between the first well 121P and the second well 123P. In the present embodiment, the materials of the buried layer 231N and the third well 125N are substantially the same. In the present embodiment, the buried layer 231N is such as an N type buried layer (NBL), an N type epitaxial layer (N-epi), a deep N type well, or a multiple N+ stacked layer.

Figure 4A:
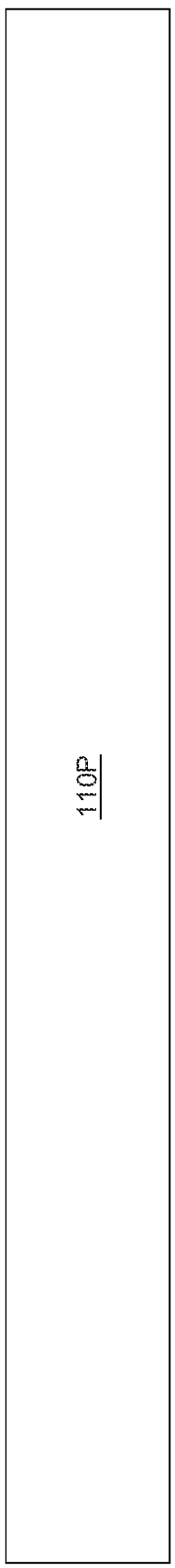

Referring to FIGS. 4A-4F, a manufacturing method of the semiconductor device 200 of the second embodiment is illustrated. Firstly, as shown in FIG. 4A, the substrate 110P is provided.

Figure 4B:
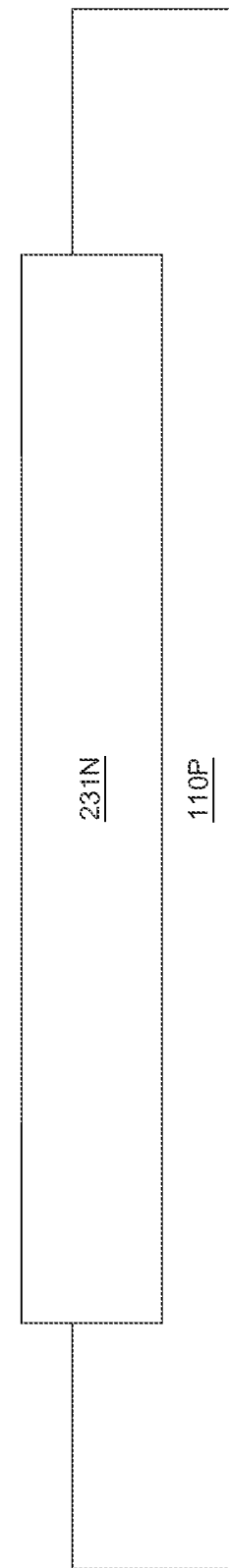

And then, as shown in FIG. 4B, the buried layer 231N is formed on the substrate 110P. In the embodiment, the buried layer 231N is formed below the to-be-formed first well 121P.

And then, as shown in FIG. 4C, an epitaxy layer 120 is formed on the substrate 110P and the buried layer 231N.

Figure 4D:
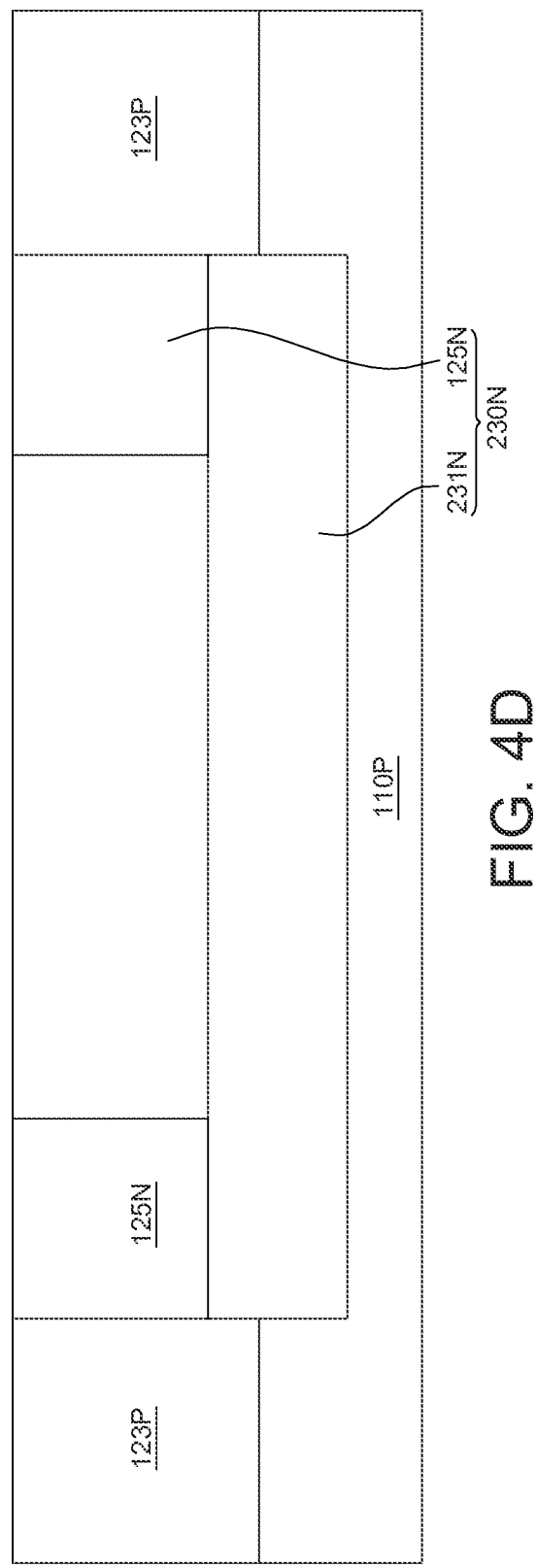

Next, as shown in FIG. 4D, the first well 121P and the third well 125N are formed on the buried layer 231N, the buried layer 231N and the third well 125N forming the first doping region 230N. In the embodiment, the second well 123P may be further formed on the substrate 110P, and the third well 125N is formed between the first well 121P and the second well 123P. In the embodiment, the first well 121P and the second well 123P are formed by such as a twin well process, and additional masks or processing steps are not required.

Figure 4E:
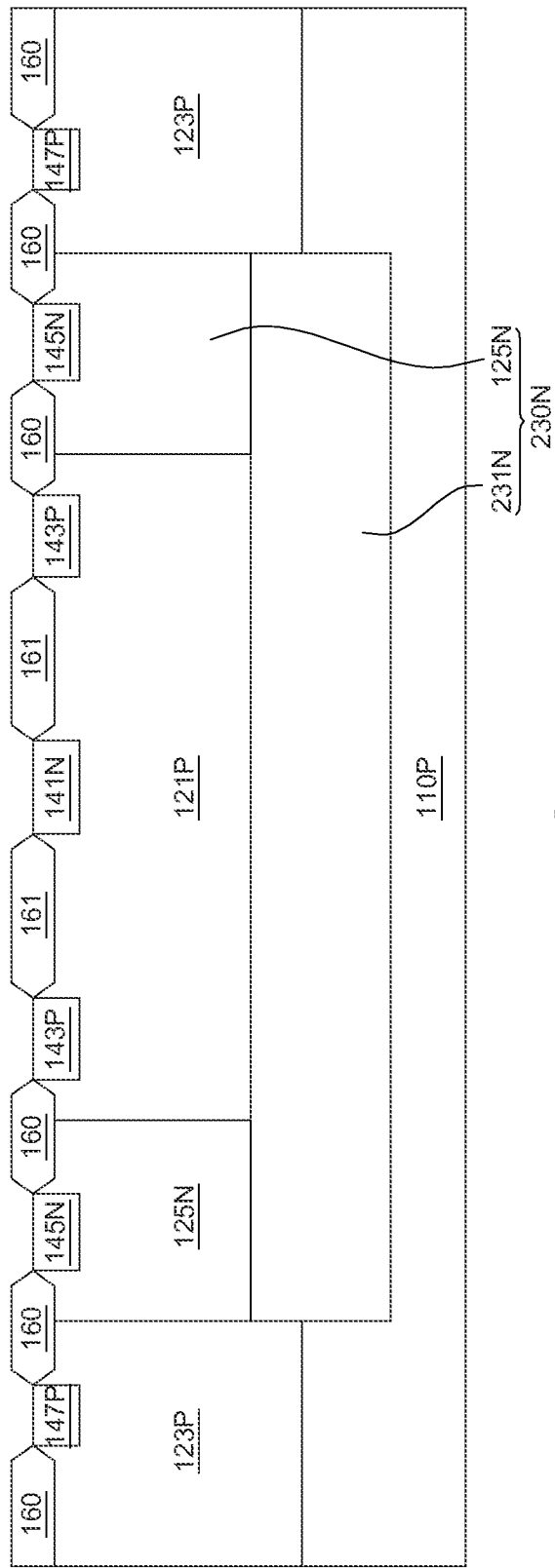

Next, as shown in FIG. 4E, the field oxide 161 is formed on the first well 121P and located between the first heavily doping region 141N and the second heavily doping region 143P. The field oxide 160 may be formed on the junction between the first well 121P and the first doping region 230N (the third well 125N) as well.

And then, as shown in FIG. 4E, the first heavily doping region 141N and the second heavily doping region 143P are formed in the first well 121P, and the third heavily doping region 145N is formed in the first doping region 230N. The first heavily doping region 141N and the second heavily doping region 143P are separated from each other. In the embodiment, the fourth heavily doping region 147P may be formed in the second well 123P as well.

Figure 4F:
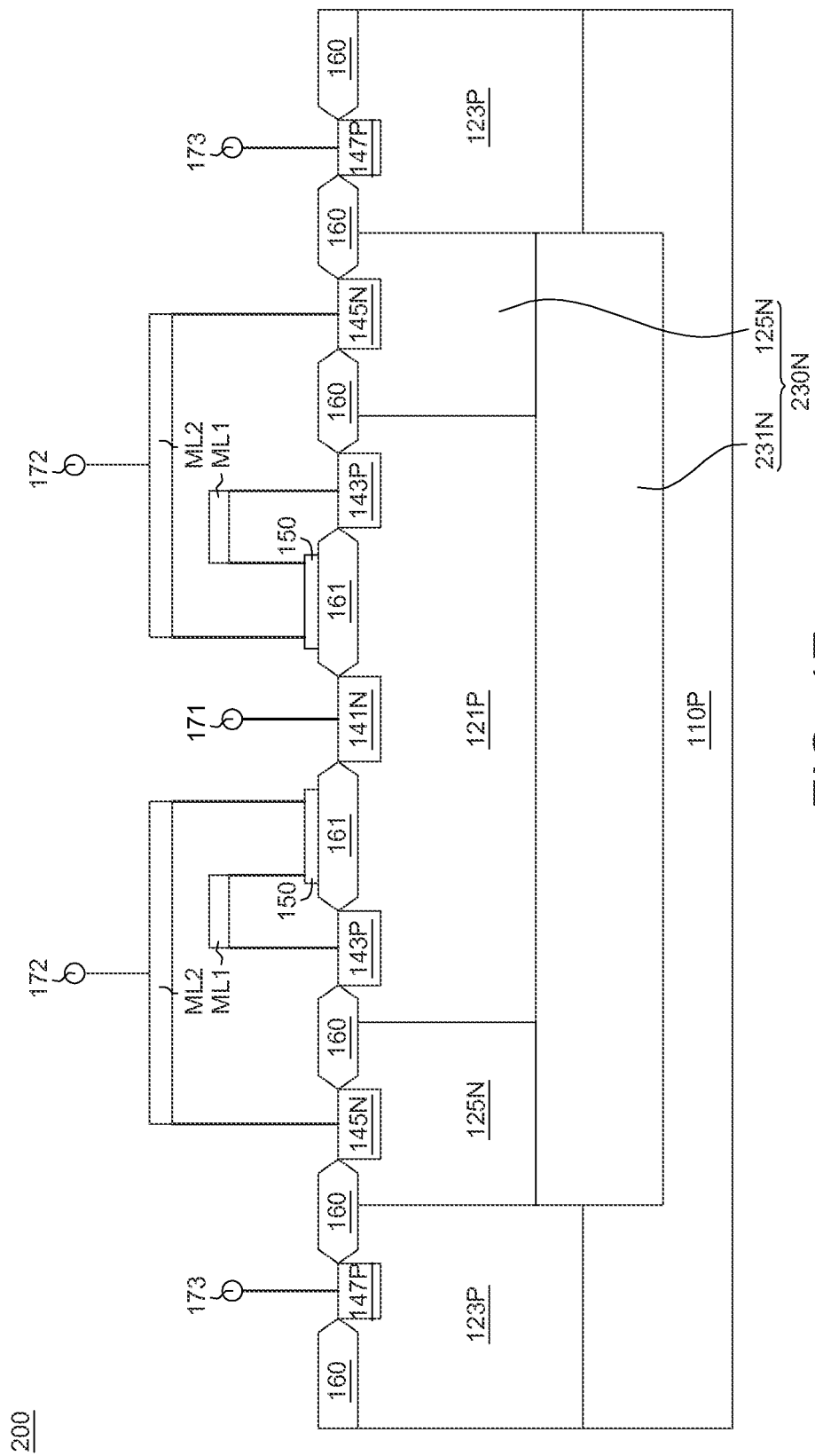

Next, as shown in FIG. 4F, the resistor element 150 is formed on the field oxide 161. In the embodiment, the resistor element 150 is formed of a polysilicon layer, for example. Base on the above steps, the semiconductor device 200 can be manufactured.

Third Embodiment

Figure 5:
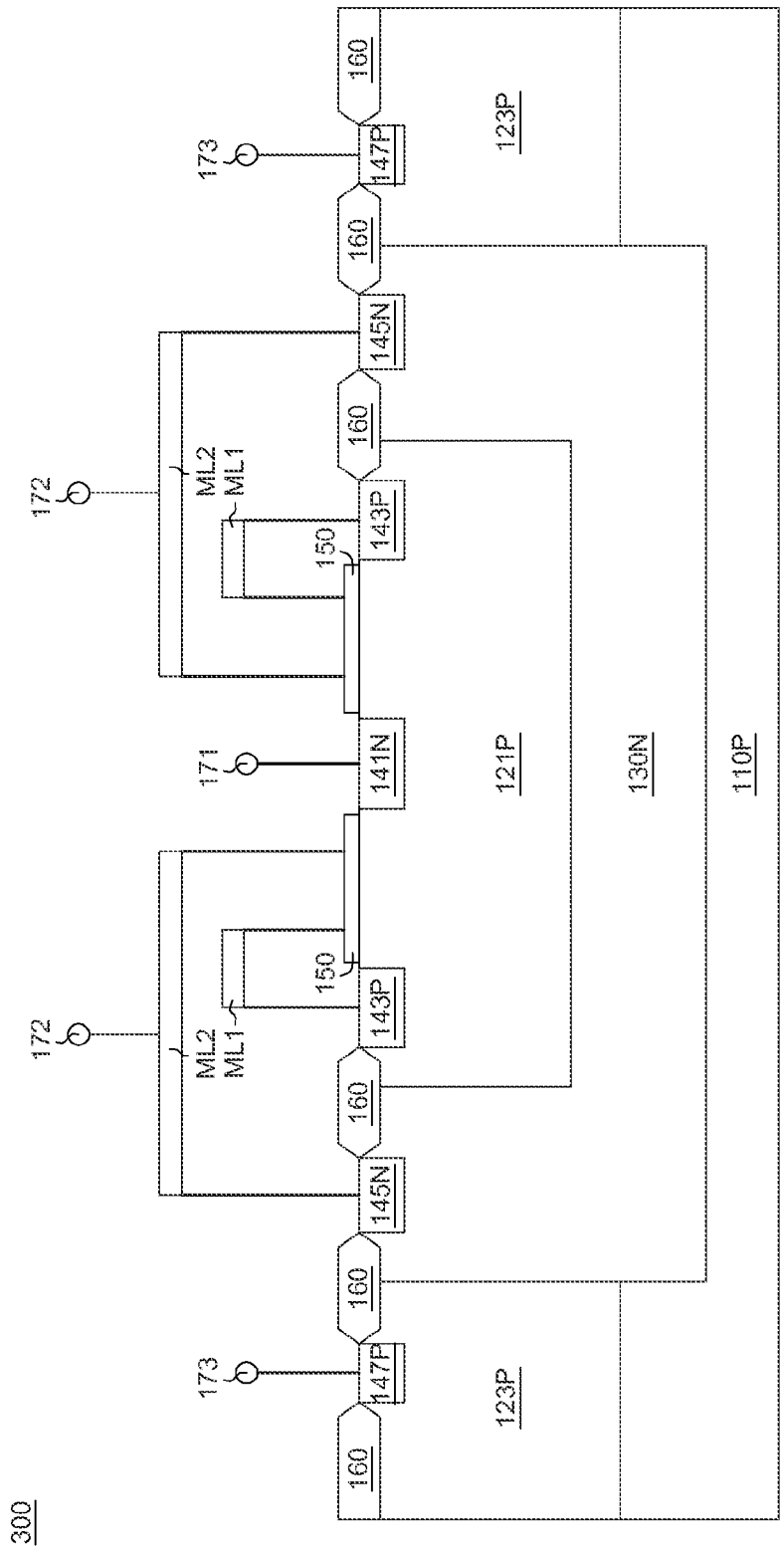
FIG. 5 shows a cross-section view of a semiconductor device of the third embodiment.

Referring to FIG. 5, a cross section view of a semiconductor device 300 of the third embodiment is shown. The semiconductor device 300 of the present embodiment is different from the semiconductor device 100 of the first embodiment in the arrangement of the resistor element 150, and the similarities are not repeated here.

In the embodiment, as shown in FIG. 5, the polysilicon layer (resistor element 150) is disposed on the first well 121P and located between the first heavily doping region 141N and the second heavily doping region 143P to separate the two regions from each other.

The manufacturing method of the semiconductor device 300 of the third embodiment is different from the manufacturing method of the semiconductor device 100 of the first embodiment in that, the field oxide 161 as shown in FIG. 1 is not formed. In other words, in the manufacturing process of the semiconductor device 300, the field oxide 160 is formed, and the resistor element 150 is formed on the first well 121P and located between the to-be-formed first heavily doping region 141N and the to-be-formed second heavily doping region 143P, followed by the formation of each of the heavily doping regions. In such case, the resistor element 150 formed prior to the formation of the heavily doping regions may function similarly to what a field oxide does (for example, the field oxide 161 as shown in FIG. 1), and each of the heavily doping regions may be formed according to the arrangement of the field oxides 160 and the resistor element 150. The similarities between the manufacturing method of the present embodiment and that of the first embodiment are not repeated here.

Fourth Embodiment

Figure 6:
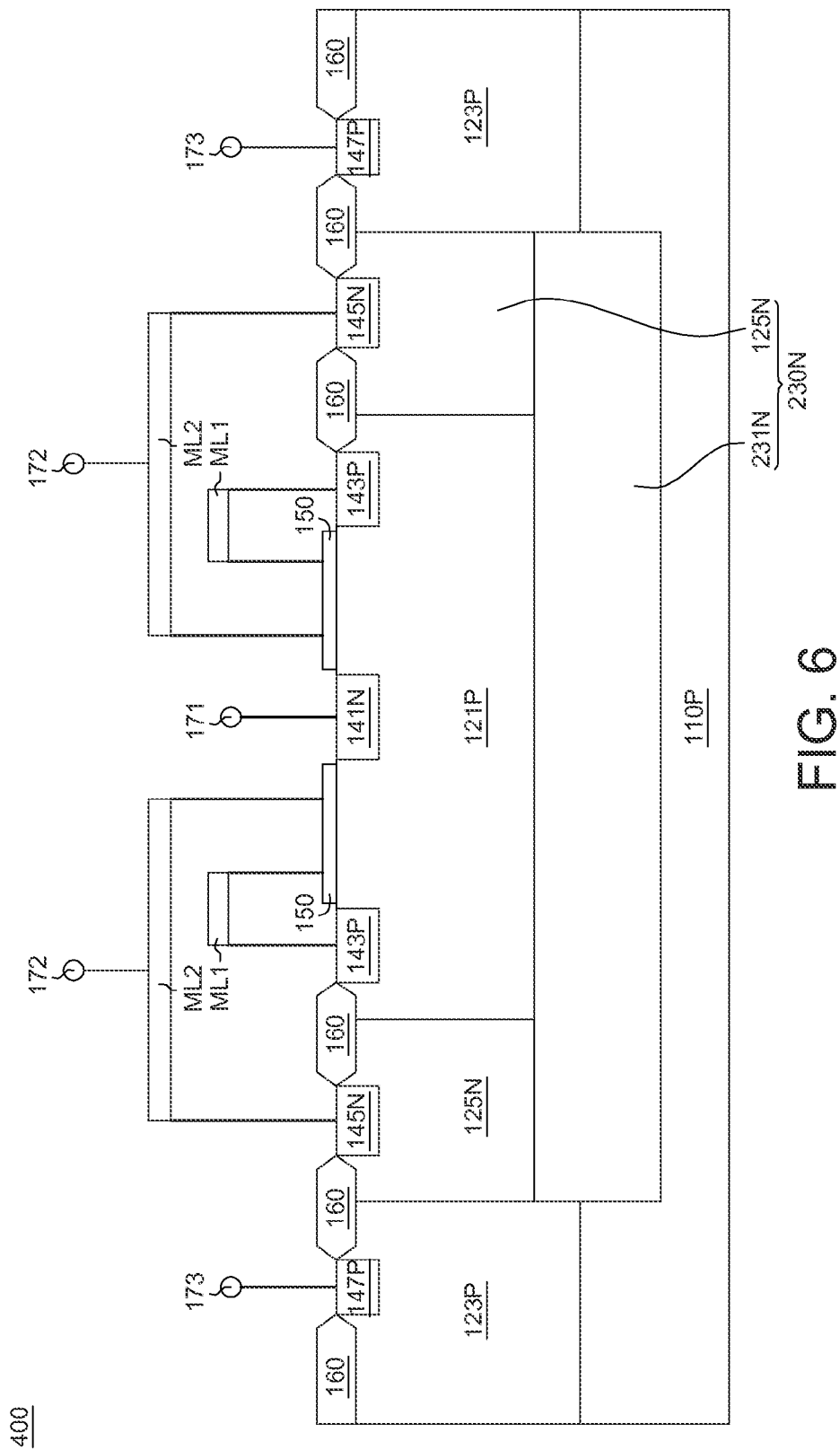
FIG. 6 shows a cross-section view of a semiconductor device of the fourth embodiment.

Referring to FIG. 6, a cross section view of a semiconductor device 400 of the fourth embodiment is shown. The semiconductor device 400 of the present embodiment is different from the semiconductor device 200 of the second embodiment in the arrangement of the resistor element 150, and the similarities are not repeated here.

In the embodiment, as shown in FIG. 6, the polysilicon layer (resistor element 150) is disposed on the first well 121P and located between the first heavily doping region 141N and the second heavily doping region 143P to separate the two regions from each other.

The manufacturing method of the semiconductor device 400 of the third embodiment is different from the manufacturing method of the semiconductor device 200 of the second embodiment in that, the field oxide 161 as shown in FIG. 2 is not formed. In other words, in the manufacturing process of the semiconductor device 400, the field oxide 160 is formed, and the resistor element 150 is formed on the first well 121P and located between the to-be-formed first heavily doping region 141N and the to-be-formed second heavily doping region 143P, followed by the formation of each of the heavily doping regions. In such case, the resistor element 150 formed prior to the formation of the heavily doping regions may function similarly to what a field oxide does (for example, the field oxide 161 as shown in FIG. 2), and each of the heavily doping regions may be formed according to the arrangement of the field oxides 160 and the resistor element 150. The similarities between the manufacturing method of the present embodiment and that of the second embodiment are not repeated here.

The semiconductor device 200 is taken as an example for describing the electrical features of the semiconductor device according to the embodiments of the disclosure. However, the described feature(s) hereinafter is not limited to direct to the semiconductor device 200. On the contrary, it is intended to cover embodiments of semiconductor devices 100 to 400 and various modifications and similar arrangements thereof.

Figure 7:
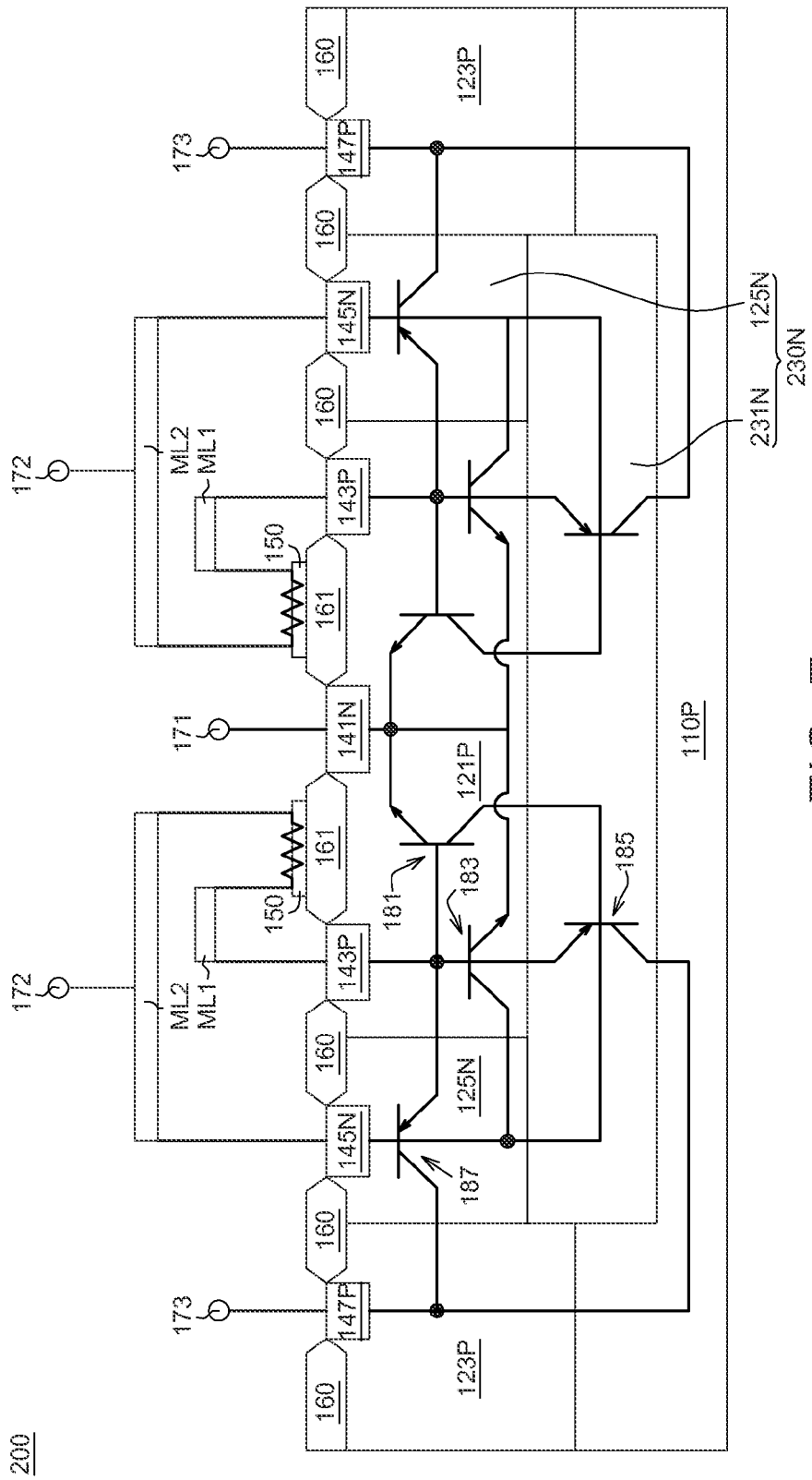
FIG. 7 shows a schematic drawing of the equivalent transistors of the semiconductor device of the second embodiment.

Referring to FIG. 7, a schematic drawing of the equivalent transistors of the semiconductor device 200 of the second embodiment is shown. As shown in FIG. 7, the substrate 110P, the first doping region 230N, the first well 121P, and the first heavily doping region 141N form a thyristor. The thyristor has an equivalent NPN transistor (e.g. equivalent NPN transistors 181 and 183) and an equivalent PNP transistor (e.g. equivalent PNP transistors 185 and 187). The equivalent NPN transistor is formed from, for example, the first doping region 230N, the first well 121P, and the first heavily doping region 141N. The equivalent PNP transistor is formed from, for example, the substrate 110P, the first doping region 230N, and the first well 121P. The base of the equivalent NPN transistor (the second heavily doping region 143P, for example) is electrically connected to the base of the equivalent PNP transistor (the third heavily doping region 145N, for example) via the resistor element 150. In the thyristor, the base of the equivalent PNP transistor is also the collector of the equivalent NPN transistor.

As shown in FIG. 7, the resistor element 150 is disposed on the field oxide 161, and the first doping region 230N (e.g. the third well 125N and/or the buried layer 231N) is electrically connected to the first well 121P via the metal layer ML2, the resistor element 150, and the metal layer ML1. The resistor element 150 creates a potential drop between the first well 121P (the base of the equivalent NPN transistors 181, 183) and the first doping region 230N (the collector of the equivalent NPN transistors 181, 183), and the potential of the first doping region 230N is higher than that of the first well 121P; as such, a depletion region is formed between the first well 121P (the base of the equivalent NPN transistors 181, 183) and the first doping region 230N (the collector of the equivalent NPN transistors 181, 183), which is advantageous to the flowing of the current, and is further advantageous to the functions of the equivalent NPN transistor (e.g. equivalent NPN transistors 181, 183). Accordingly, due on the function of the equivalent NPN transistor, the current is driven to flow through the first doping region 230N and the metal layer ML2 to the second electrode 172 (e.g. the collector end of the equivalent NPN transistors 181, 183), and the current flowing from the second well 123P and/or the substrate 110P to the third electrode 173 is reduced, such that the substrate leakage is reduced, and the ESD protection is improved.

Figure 8:
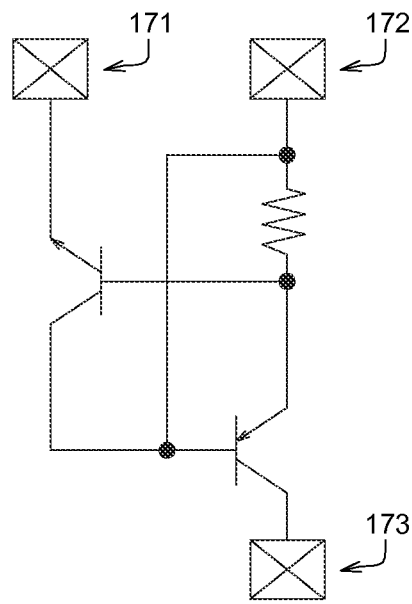
FIG. 8 shows an equivalent circuit of the semiconductor device of the embodiments.

Referring to FIG. 8, an equivalent circuit of the semiconductor device of the embodiments is shown. As shown in FIG. 8, the resistor element 150 creates a potential drop between the base and the collector of the equivalent NPN transistor, and thus the substrate leakage is reduced.

Figure 9:
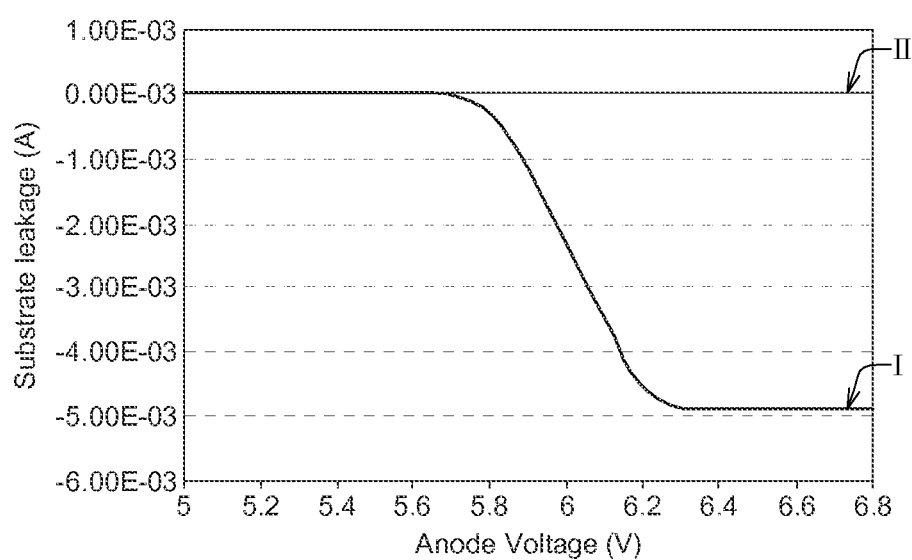
FIG. 9 shows an I-V curve of the semiconductor device of the second embodiment.

Referring to FIG. 9, an I-V curve of the semiconductor device 200 of the second embodiment is shown. Curve I represents the relationship between the substrate leakage and the voltage Vanode applied to the anode for a conventional isolation diode, and curve II represents the relationship between the substrate leakage and the voltage Vanode applied to the second electrode 172 for the semiconductor device 200 of the second embodiment. In the embodiment, the third electrode 173 as shown in FIG. 7 is such as a test electrode, and the current measurement of the substrate leakage is obtained from the third electrode 173. As shown in FIG. 9, as the voltage Vanode is increased from 5V to higher than about 6.2V, the substrate leakage represented by curve I is at mA level, while the substrate leakage represented by curve II is only at μA level. The difference between curve I and curve II is up to about 2 orders. In other words, it is apparent that the semiconductor device according to the embodiments of the present disclosure can effectively and largely reduce the substrate leakage of isolation diodes.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:
1. A semiconductor device, comprising:
a substrate;
a first doping region disposed on the substrate;
a first well disposed in the first doping region;
a first heavily doping region disposed in the first well;
a second heavily doping region disposed in the first well, wherein the second heavily doping region is separated from the first heavily doping region;
a third heavily doping region disposed in the first doping region;
a resistor element disposed on the first well, wherein the second heavily doping region is electrically connected to the third heavily doping region via the resistor element, and both of the resistor element and the third heavily doping region are connected to an electrode; and
a field oxide (FOX), wherein the field oxide is disposed under the resistor element and separates the first heavily doping region and the second heavily doping region, and wherein the entire field oxide is disposed on the first well;
wherein each of the substrate, the first well, and the second heavily doping region has a first type doping, each of the first doping region, the first heavily doping region, and the third heavily doping region has a second type doping, and the first type doping is complementary to the second type doping.

2. The semiconductor device according to claim 1, further comprising:
a second well disposed on the substrate, wherein the first doping region is disposed between the first well and the second well, and the second well has the first type doping.

3. The semiconductor device according to claim 2, further comprising:
a fourth heavily doping region disposed in the second well, wherein the fourth heavily doping region has the first type doping.

4. The semiconductor device according to claim 1, wherein the resistor element is a polysilicon layer.

5. The semiconductor device according to claim 1 wherein the field oxide is located between the first heavily doping region and the second heavily doping region.

6. The semiconductor device according to claim 5, wherein the resistor element is a polysilicon layer, which is disposed on the field oxide.

7. A semiconductor device, comprising:
a thyristor having an equivalent NPN transistor and an equivalent PNP transistor; and
a resistor element, wherein a base of the equivalent NPN transistor is electrically connected to a base of the equivalent PNP transistor via the resistor element, wherein the thyristor comprises:
a substrate;
a first doping region disposed on the substrate;
a first well disposed in the first doping region; and
a field oxide (FOX), wherein the field oxide is disposed under the resistor element and separates a heavily doping region and a second heavily doping region, and wherein the entire field oxide is disposed on the first well;

wherein each of the substrate and the first well has a first type doping, the first doping region has a second type doping, and the first type doping is complementary to the second type doping.

8. The semiconductor device according to claim 7, wherein the first heavily doping region disposed in the first well; and
wherein the first heavily doping region has a second type doping.

9. A manufacturing method of a semiconductor device, comprising:
providing a substrate;
forming a first doping region on the substrate;
forming a first well in the first doping region;
forming a first heavily doping region in the first well;
forming a second heavily doping region in the first well, wherein the second heavily doping region is separated from the first heavily doping region;
forming a third heavily doping region in the first doping region;
forming a resistor element on the first well, wherein the second heavily doping region is electrically connected to the third heavily doping region via the resistor element, and both of the resistor element and the third heavily doping region are connected to an electrode; and
forming a field oxide (FOX), wherein the field oxide is disposed under the resistor element and separates the first heavily doping region and the second heavily doping region, and wherein the entire field oxide is disposed on the first well;
wherein each of the substrate, the first well, and the second heavily doping region has a first type doping, each of the first doping region, the first heavily doping region, and the third heavily doping region has a second type doping, and the first type doping is complementary to the second type doping.

10. The manufacturing method of the semiconductor device according to claim 9, further comprising:
forming a second well on the substrate, wherein the first doping region is formed between the first well and the second well, and the second well has the first type doping.

11. The manufacturing method of the semiconductor device according to claim 10, further comprising:
forming a fourth heavily doping region in the second well, wherein the fourth heavily doping region has the first type doping.

12. The manufacturing method of the semiconductor device according to claim 9, wherein the resistor element is a polysilicon layer.

13. The manufacturing method of the semiconductor device according to claim 12, wherein the step of forming the field oxide comprises
forming the field oxide between the first heavily doping region and the second heavily doping region.

14. The manufacturing method of the semiconductor device according to claim 13, wherein the step of forming the resistor element comprises:
forming the polysilicon layer on the field oxide.

* * * * *